Sept. 29, 1970 MASARU TANAKA ET AL 3,531,336

METHOD OF MAKING A SWITCHING ELEMENT

Filed Aug. 10, 1967

INVENTORS
MASARU TANAKA, AKIO YAMASHITA,
TAKASHI FUJITA

BY Stevens, Davis, Miller & Mosher
ATTORNEYS 3,531,336

METHOD OF MAKING A SWITCHING ELEMENT

Masaru Tanaka, Toyonaka-shi, Akio Yamashita, Ikeda-shi, and Takashi Fujita, Toyonaka-shi, Japan, assignors to Matsushita Electric Industrial Co., Ltd., Osaka, Japan, a corporation of Japan Filed Aug. 10, 1967, Ser. No. 659,752
Claims priority, application Japan, Dec. 13, 1966, 41/82,592; Dec. 29, 1966, 42/1,165; Mar. 13, 1967, 42/16,190
Int. Cl. H01l 7/46
U.S. Cl. 148—178 6 Claims

ABSTRACT OF THE DISCLOSURE

Semiconductor switching elements having negative resistance characteristics being characterized in that a region having a high concentration of deep-level impurity is formed in the vicinity of the electrical junction surface of the semiconductor, which has hitherto been considered to be difficult.

This invention relates to semiconductor switching elements having negative resistance characteristics.

According to conventional methods of making a switching element using a deep-level impurity and exhibiting a current controlled type negative resistance, an electric connection is provided after a deep-level impurity is added to the body of a semiconductor by diffusion or by doping. In this method, however, since the deep-level impurity generally has a large diffusion coefficient in a semiconductor and is mobile and easily gettered, it is quite difficult to form a region having a high concentration of deep-level impurity at and in the vicinity of the junction surface.

This invention is intended to obviate the deficiencies described above and it is an object of the invention to provide a method whereby the concentration of deep-level impurity can be increased at and in the vicinity of the electric connection (at and in the vicinity of the junction surface).

Figure 1:
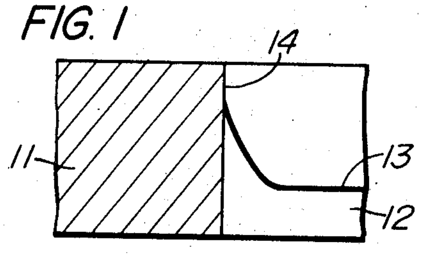
Figure 2:
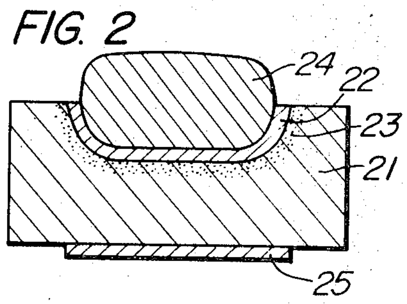
Figure 3:
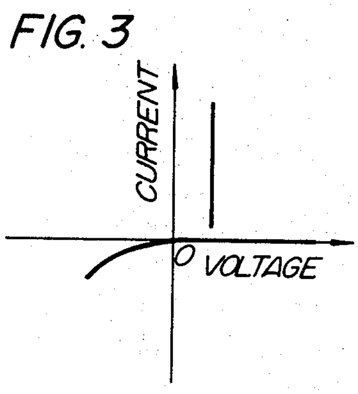
Figure 6:
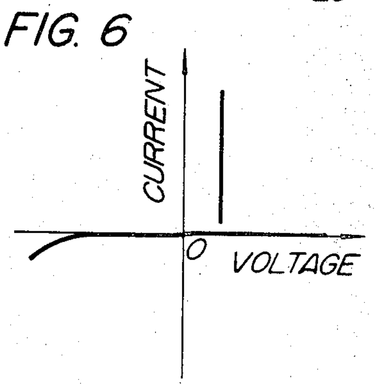
Figure 4:
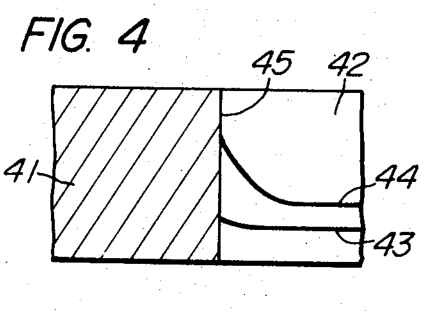
Figure 5:
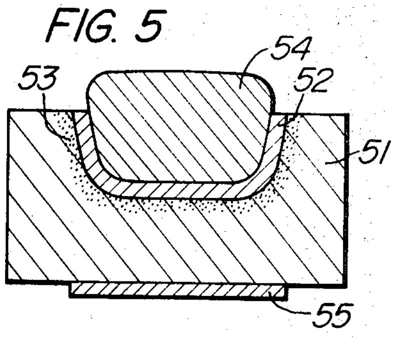
Figure 8:
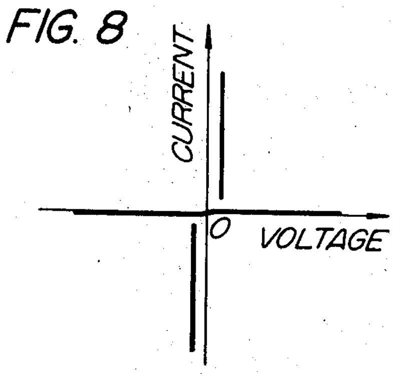
Figure 7:
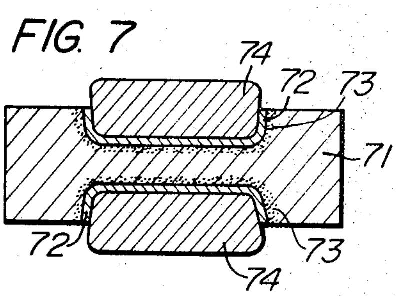

Other objects, features and advantages of the invention will become apparent from the following detailed description of the invention when taken in conjunction with the accompanying drawings; wherein, FIG. 1 illustrates the principle of the invention, FIG. 2 is a sectional diagram of a diode fabricated according to the invention, FIG. 3 shows a voltage vs. current characteristic obtained with the diode shown in FIG. 2, FIG. 4 illustrates the principle of making another embodiment of the invention, FIG. 5 is a sectional diagram of the embodiment explained in FIG. 4, FIG. 6 shows a voltage vs. current characteristic obtained with the embodiment shown in FIGS. 4 and 5, FIG. 7 is a sectional diagram of yet another embodiment of the invention, and FIG. 8 shows a voltage vs. current characteristic obtained with the embodiment shown in FIG. 7.

FIG. 1 is a diagram illustrating the principle of the invention, wherein the numeral 11 indicates a liquid phase, the numeral 12 indicates a solid phase and the numeral 13 shows the distribution of the concentration of deep-level impurity. The liquid phase is an eutectic alloy of a metal material and a semiconductor body constituting the solid phase, and, also in said liquid phase is included a deep-level impurity. Such liquid is formed at a temperature below the melting point of the semiconductor body constituting the solid phase and is in equilibrium at a boundary surface 14. Namely, the number of atoms which solidify from the liquid phase to the solid phase is equal to that of atoms which resolve from the solid phase to the liquid phase. In this case, the deep-level impurity atoms in the liquid phase diffuse into the solid phase at a definite rate. When the temperature of the system is lowered, the boundary surface 14 moves towards the liquid phase. In other words, the solid phase of the semiconductor body grows out of the liquid phase. If the temperature is decreased rapidly in this case, the deep-level impurity in the solid phase does not diffuse into the recrystallized layer, but segregates and deposits on the right side of the initial boundary surface or interface 14 between the two phases. Thus, the distribution of concentration as indicated by 13 is obtained.

What is important here is that it is necessary for a large amount of deep-level impurity to have diffused from the liquid phase into the solid phase and the present invention consists in rapidly decreasing the temperature of the system thereby to trap and keep the diffused deep-level impurity at and in the vicinity of the interface.

As is evident from the formula, $$K_i^f = \alpha_i^f \exp - \frac{\Delta H_i^f}{RT}$$

where $K_i^f$: rate at which the impurity enters the solid phase from the liquid phase
$\alpha_i^f$: constant
$\Delta H_i^f$: height of the barrier to be penetrated by the atoms entering the solid phase from the liquid phase
R: gas constant
T: absolute temperature it is only required to lower the barrier height $\Delta H_i^f$ or to increase the temperature of the system in order to make a large amount of impurity diffuse from the liquid phase into the solid phase.

Now, the embodiments of the invention will be described in detail hereinbelow.

Si is used as a semiconductor body and Au is used to form eutectic alloy therewith. Au is utilized also as a deep-level impurity in Si. Now, an alloy treatment is done to P-type Si by use of a foil of Au (including 0.8% Sb). According to an ordinary method, the alloy treatment is done at 600° C.–700° C. The alloy is further heated, in the present invention, at a temperature no lower than 1000° C. Thus, Au and Si form a liquid phase eutectic alloy. Since the temperature is rather high, Au sufficiently diffuses into the solid phase formed by Si. When the temperature is lowered rapidly, a region including a high concentration of Au is formed at and in the vicinity of the boundary surface as described hereinabove and the recrystallizer layer becomes thin.

FIG. 2 shows a sectional diagram of a diode fabricated in this way. In the figure, reference numeral 21 designates a P-type Si semiconductor body, reference numeral 22 designates an N-type recrystallized layer, reference numeral 23 designates a region having a high concentration of Au, reference numeral 24 designates an Au region including Si and reference numeral 25 designates an electrode in ohmic contact with the P-type semiconductor body. The voltage vs. current characteristic measured with said element exhibits a sharp current controlled type negative resistance as shown in FIG. 3. This fact is due to the increase of the concentration of Au at and in the vicinity of the junction surface.

Now, another embodiment of the invention will be described.

In FIG. 4, reference numerals 41 and 42 indicate liquid phase and solid phase, respectively, reference numeral 43 shows the distribution of the concentration of deep-level impurity previously added to a semiconductor bulk by diffusion or by doping and reference numeral 44 denotes a curve showing the concentration distribution of deep-level impurity obtained by alloy diffusion. In this case, the liquid phase 41 is a eutectic alloy of a metal material and the semiconductor body constituting the solid phase 42 and deep-level impurity is included in said liquid phase. As is described hereinabove, if the deep-level impurity which has diffused from the liquid phase 41 into the solid phase 42 is frozen, i.e., captured at and in the vicinity of the junction, by rapid cooling, the concentration distribution, shown by curve 44, of the deep-level impurity deposited at and in the vicinity of the boundary surface 45 by alloy diffusion and the concentration distribution, shown by curve 43, of the deep-level impurity previously added to the semiconductor bulk are added to each other to greatly increase the impurity concentration at and in the vicinity of the boundary surface 45. As a result, a sharp negative resistance characteristic having a less leakage current than the former embodiment as shown in FIG. 6 is obtained.

A more concrete method of manufacture is explained with reference to FIG. 5. In the figure, 51 designates a P-type Si semiconductor body doped with Cu, 52 indicates an N-type Si recrystallized layer which is formed by rapidly cooling a liquid phase of a eutectic alloy of a Au (including 0.8% Sb) foil and the Si semiconductor body, the liquid phase being formed by a heat treatment at a high temperature, that is, at a temperature no lower than 1000° C., 53 designates a region having a high concentration of Au, 54 designates a Au region including Si and Cu and 55 designates an electrode provided to the semiconductor body 51. The voltage vs. current characteristic of this switching element exhibits a very sharp current controlled type negative resistance as shown in FIG. 6. Said characteristic is obtained because the concentration of Cu and the concentration of Au are added to each other to give a very high concentration of deep-level impurity at and in the vicinity of the junction surface and as a result the avalanche multiplication factor at and in the vicinity of said junction surface becomes very large.

FIG. 7 is a sectional diagram of a further embodiment of the invention, which is obtained by modifying said either embodiment so that the structure may become symmetrical with respect to the semiconductor body. In the figure, 71 designates a P-type Si semiconductor body doped with Cu, 72 designates an N-type recrystallized Si layer, 73 designates a region having a high concentration of Au and 74 designates electrodes in the Au region including Si and Cu. The voltage vs. current characteristic of this element is a sharp bilateral current controlled type negative resistance, as shown in FIG. 8, because the structure is symmetrical.

It is to be noted that although a case where P-type Si is used for a semiconductor body is described in the above embodiments, the same characteristic can be obtained with N-type Si having a specific resistance over 1 ohm-cm. As the semiconductor, other semiconductors, like Ge, can be used instead of Si without changing the effect of the invention.

Further, in the above embodiments, the material for forming eutectic alloy is the same as the impurity material, but these materials may be different. For example, Cu, Fe, Co, Mn, Ni or the like can be used as the impurity. As the deep-level impurity to be added to the semiconductor body in advance, one or more materials chosen from Cu, Fe, Co, Ni, Mn and the like can be used.

Further, though a switching element comprising only two electrodes is described hereinabove, a third electrode may be provided to a part of the semiconductor body to form a gate electrode. Thus, gate control can be easily performed.

As is fully described hereinabove, the method of making a switching element according to the present invention is a simple one, characterized in that deep-level impurity is diffused from liquid phase eutectic alloy into a solid phase semiconductor body. A switching element of this invention has a much smaller leakage current and a negative resistance exhibiting much sharper rise characteristics than conventional switching elements. Therefore, the present invention enjoys a wide range of industrial application.

What is claimed is:

1. A method of making a semiconductor switching element having negative resistance characteristics, comprising the steps of alloying a semiconductor body with at least one metal member in a conventional manner to form at least one liquid phase of a eutectic alloy of the metal member and the semiconductor body, the metal member including a material serving as a deep energy level impurity with respect to the semiconductor body; heating the resulting combination at a temperature of at least 1000° C. to effect a diffusion of said impurity from said liquid phase into the semiconductor body in a solid phase; and thereafter rapidly cooling said combination to form at least one recrystallized region and at least one region of a high concentration of said deep energy level impurity at and in the vicinity of the interface between the recrystallized layer and the semiconductor body.

2. A method of making a semiconductor switching element as defined in claim 1, further comprising including at least one additional deep energy level impurity in said semiconductor body prior to alloying said body with said metal member.

3. A method of making a semiconductor switching element as defined in claim 1, comprising alloying two metal members on opposite surface portions of said semiconductor body thereby forming two of each of the recrystallized region and the high concentration region of the deep energy level impurity by the subsequent heating and rapid cooling steps so that the switching element exhibits symmetrical negative resistance characteristics.

4. A method of making a semiconductor switching element as defined in claim 1, wherein said metal member itself also serves as the deep energy level impurity to be diffused.

5. A method of making a semiconductor switching element as defined in claim 1, wherein the semiconductor body is made of Si or Ge and the deep energy level impurity to be diffused is selected from the group consisting of Au, Cu, Fe, Co, Mn, and Ni.

6. A method of making a semiconductor switching element as defined in claim 2, wherein the semiconductor body is made of Si or Ge and said additional deep level impurity is selected from the group consisting of Au, Cu, Fe, Co, Mn, and Ni.

References Cited

UNITED STATES PATENTS 3,442,722 5/1969 Bauerlein et al. ----- 148—178

RICHARD O. DEAN, Primary Examiner

U.S. Cl. X.R.

148—185